United States Patent
Lin

(10) Patent No.: US 8,937,375 B2
(45) Date of Patent: Jan. 20, 2015

(54) SUBSTRATE STRUCTURE, SEMICONDUCTOR DEVICE ARRAY AND SEMICONDUCTOR DEVICE HAVING THE SAME

(75) Inventor: Chen-Hsiu Lin, New Taipei (TW)

(73) Assignees: Lite-On Electronics (Guangzhou) Limited, Guangzhou (CN); Lite-On Technology Corporation, Taipei (TW)

( * ) Notice: Subject to any disclaimer, the term of this patent is extended or adjusted under 35 U.S.C. 154(b) by 260 days.

(21) Appl. No.: 13/468,790

(22) Filed: May 10, 2012

(65) Prior Publication Data

US 2013/0015565 A1 Jan. 17, 2013

Related U.S. Application Data

(60) Provisional application No. 61/508,123, filed on Jul. 15, 2011.

(51) Int. Cl.
| | |
|---|---|
| H01L 23/495 | (2006.01) |
| H01L 23/498 | (2006.01) |
| H01L 23/544 | (2006.01) |
| H01L 33/64 | (2010.01) |

(52) U.S. Cl.
CPC ........ *H01L 23/49861* (2013.01); *H01L 23/544* (2013.01); *H01L 33/64* (2013.01); *H01L 2223/54426* (2013.01); *H01L 2223/54486* (2013.01); *H01L 2924/0002* (2013.01)

USPC ................. 257/669; 257/E23.051; 174/250; 174/251; 174/255; 174/260; 174/261

(58) Field of Classification Search
USPC .......... 257/669, E23.051; 174/250, 251, 255, 174/260, 261
See application file for complete search history.

(56) References Cited

U.S. PATENT DOCUMENTS

| | | | | |
|---|---|---|---|---|
| 5,336,931 | A | * | 8/1994 | Juskey et al. ................. 257/787 |
| 6,710,265 | B2 | * | 3/2004 | Owens ........................... 174/260 |
| 2007/0062729 | A1 | * | 3/2007 | Asai et al. ..................... 174/262 |

* cited by examiner

*Primary Examiner* — Peniel M Gumedzoe
(74) *Attorney, Agent, or Firm* — Li & Cai Intellectual Property (USA) Office

(57) ABSTRACT

A substrate structure has a first surface and a second surface. A plurality of carrying members are formed on the first surface and a plurality of conductive traces are formed on the second surface. In addition, the substrate structure has a first, a second and a third thermal stress relief structures. The first thermal stress relief structure is that lengths of the substrate structure in different axial directions are substantially equal to each other. The second thermal stress relief structure is that a plurality of separated alignment marks are formed on the substrate structure. The third thermal stress relief structure is that the substrate structure has at least one clearance area extending along one of the axial directions of the substrate structure and the clearance area has no carrying members and no conductive traces formed thereon.

20 Claims, 9 Drawing Sheets

SUBSTRATE STRUCTURE, SEMICONDUCTOR DEVICE ARRAY AND SEMICONDUCTOR DEVICE HAVING THE SAME

BACKGROUND OF THE INVENTION

1. Field of the Invention

The present invention relates to a substrate structure, a semiconducting device array and a semiconducting device having the same. In particular, the present invention relates to a substrate structure, a semiconductor device array and a semiconductor device having a diminished warpage after a heating process.

2. Description of Related Art

Electronic devices consume part of electrical energy for processing and consume another part of electrical energy to transform into waste heat. The waste heat may be accumulated inside the electronic devices and the accumulated heat may cause the electronic devices failure if no improved heat dissipating technique is developed. For example, high power LEDs can emit light with higher brightness but also generate more heat due to higher electrical current and power. The heat may influence the performance of LEDs and further cause LEDs failure.

For improving the heat dissipating efficiency, a heat dissipation substrate has been developed. The heat dissipation substrate is formed by laminating a slug (i.e., metal materials) and composite materials, such as polymer materials. An LED chip is generally mounted on the slug of the heat dissipation substrate and heat generated from the LED chip is transmitted through the slug. However, the thermophysical property of the metal materials is such different from that of the composite materials as to result in a coefficient of thermal expansion (CTE) mismatch issue. After high temperature process, such as a reflow process, the two different materials of the substrate have different expansion ratio to generate thermal stress therebetween and make the substrate deformed.

SUMMARY OF THE INVENTION

One object of the instant disclosure is providing a substrate structure, a semiconductor device array and a semiconductor device having the same. The substrate structure has at least one kind of thermal stress relief structure to release the thermal stress and further achieve the minimum warpage of the substrate structure. Thus, the reliability of the semiconductor device array or the semiconductor device using the present substrate structure is improved.

By using the mentioned thermal stress relief structures, the CTE mismatch issue resulted from different thermophysical properties between various materials of the substrate structure may be solved. In other words, the deformation of the substrate structure resulted from thermal stress after the high temperature process may be avoided.

For further understanding of the instant disclosure, reference is made to the following detailed description illustrating the embodiments and examples of the instant disclosure. The description is for illustrative purpose only and is not intended to limit the scope of the claim.

DETAILED DESCRIPTION OF THE PREFERRED EMBODIMENTS

The instant disclosure provides a substrate structure which is capable to carry semiconductor elements, such as light emitting diode chips. Particularly, the substrate structure, for example a printed circuit board (PCB) is laminated by pressing composite materials and metal materials. The composite materials may be a polymer, such as glass fibers, being an anisotropic material. In other words, the composite materials have different properties on the different axial directions thereof. For example, the composite materials (i.e., BT material and FR-4 material) have an anisotropic CTE as shown in Table 1. On the other hand, the metal materials of the substrate structure, such as Cu, have a thermophysical property substantially different from that of the composite materials, hence a CTE mismatch issue occurs. Due to the CTE mismatch issue, such two materials of the substrate structure have different expansion volumes after high temperature processes, and the different expansion volumes cause thermally-induced stress (i.e., thermal stress) to deform the substrate structure. Based on the analysis of the thermal stress, the CTE, the elastic modulus (E) and the glass transition temperature (Tg) of the packaging material shown in Table 1 may be impact factors for the thermal stress. To avoid the deformation of the substrate structure resulted from thermal stress, some thermal stress relief structure are applied to diminish warpage of the substrate structure and achieve the minimum warpage thereof

TABLE 1

| Substrate type | Material | E (GPa) | Poisson ratio | CTE (ppm/° C.) | Tg (° C.) |
|---|---|---|---|---|---|
| Cu | Cu | 110.0 | 0.35 | 18.0 | — |
| BT | AMC | $45.5 \times 10^{-3}$ | 0.14/0.02 | 13.0/15.0/31.0 | 230 |
| FR-4 | MCL-E-679 (W) | 3.2 | 0.3 | 15.0/17.0/60.0 | 173~183 |

Figure 1A:
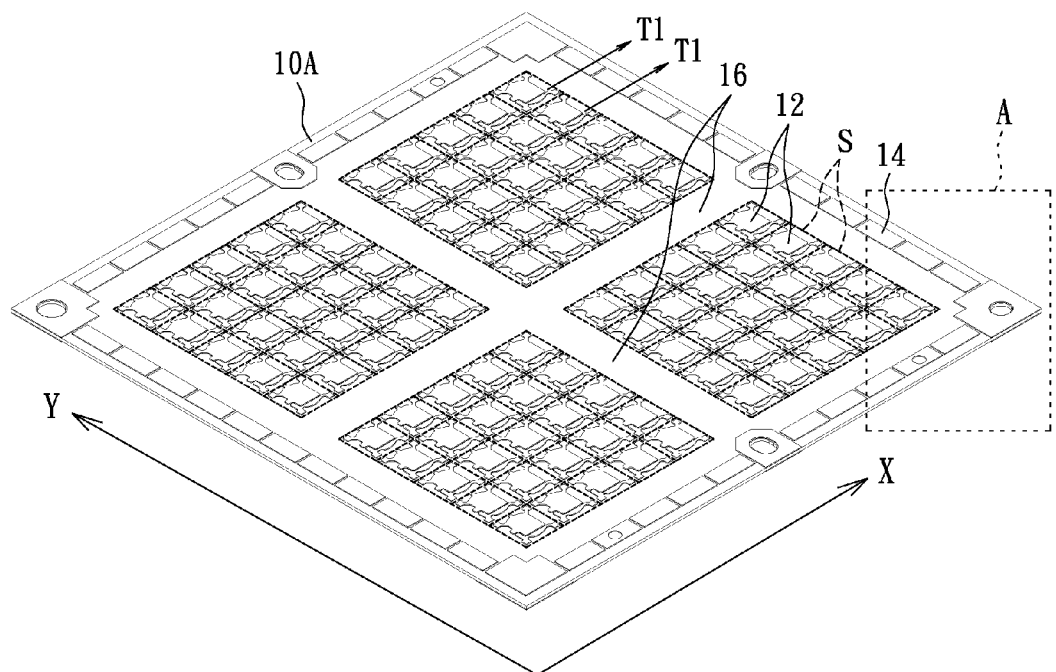
FIG. 1A shows a top-view of the substrate structure of the instant disclosure.
Figure 1B:
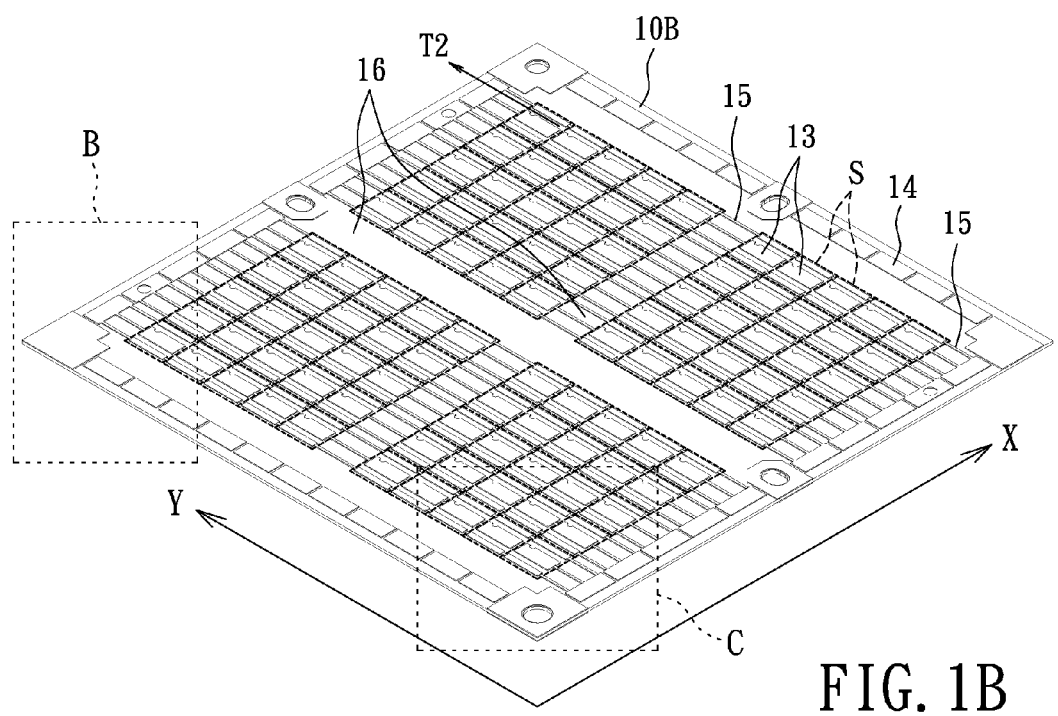
FIG. 1B shows a bottom-view of the substrate structure of the instant disclosure.
Figure 2:
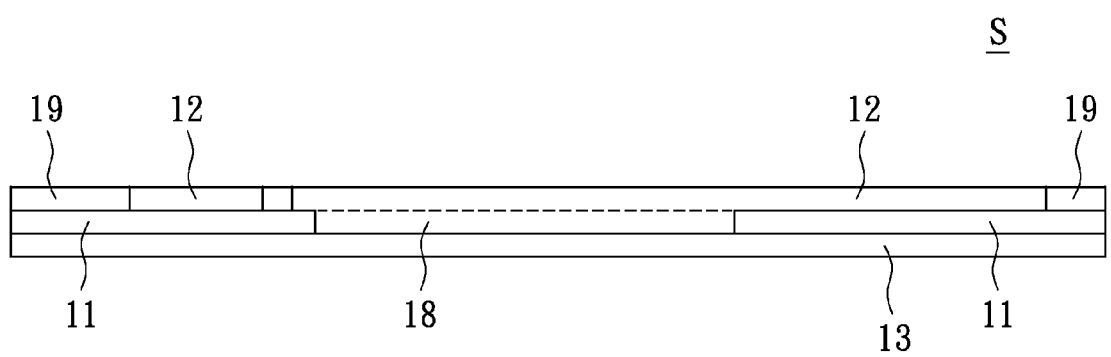
FIG. 2 shows a sectional view of the substrate structure of the instant disclosure.
Figure 3A:
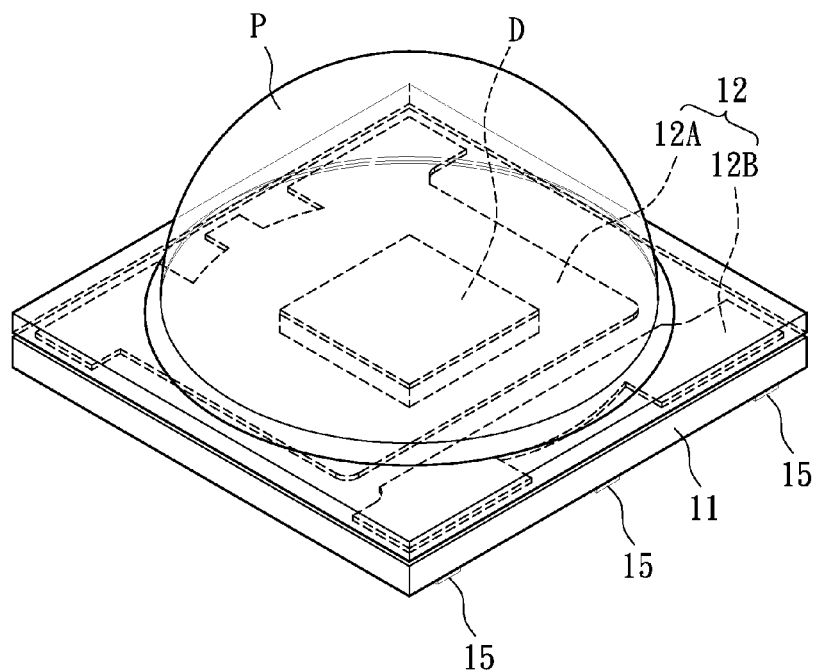
FIG. 3A shows a perspective view of the semiconductor device of the instant disclosure.

Please refer to FIGS. 1A and 1B. The present substrate structure is provided to minimize effect for the resulted thermal stress and prevent the substrate structure deformation or warpage. It should be noted that the substrate structure illustrated in FIGS. 1A and 1B has various kinds of the thermal stress relief structures and at least one of the thermal stress relief structures can be applied to minimize the effect of thermal stress upon the substrate. In other words, the thermal stress relief structures may be solely or multi selected to diminish the effect of the thermal stress. Further, the substrate structure has corresponding first and second surfaces 10A, 10B. A plurality of carrying members 12 are formed on the first surface 10A and a plurality of conductive traces 13 are formed on the second surface 10B. The layout of the carrying members 12 corresponds to that of the conductive traces 13 so as to define multi substrate units "S" on the substrate structure. FIG. 2 shows a single substrate unit "S" and the substrate structure has a core layer 11 (a.k.a. an insulting layer). The carrying members 12 are formed on an upper surface (i.e., the first surface 10A in FIG. 1A) of the core layer 11 and the conductive traces 13 are formed on the lower surface (i.e., the second surface 10B in FIG. 1B) of the core layer 11. Specifically, the core layer 11 is a cured prepreg manufactured by dipping glass fabrics into a resin solution, and the carrying members 12 and the conductive traces 13 are circuit made of metal, such as Cu, and are laminated with the cured prepreg. The carrying members 12 and the conductive traces 13 respectively arranged on the upper and the lower surfaces of the core layer 11 to provide electric contacts. Moreover, a slug 18 (a.k.a. a heat dissipating component or heat sink) made of metal is embedded in the core layer 11 to electrically connect between the carrying members 12 and the conductive traces 13. In other embodiment, the carrying members 12, the conductive traces 13 and the slug 18 may be formed integrally by a single metal material. Furthermore, solder masks 19 are formed on the upper surface (i.e., the first surface 10A) of the core layer 11 and are provided for overlying at least a part of the circuit on the substrate structure to prevent the oxidation of the circuits. The part of the carrying members 12 exposed from the solder masks 19 are used to connect with a semiconductor element "D", as shown in FIG. 3A, by soldering or wire-bonding. Moreover, the solder masks 19 and the carrying members 12 define a planar surface to proceed the usage of the substrate structure.

Figure 3B:
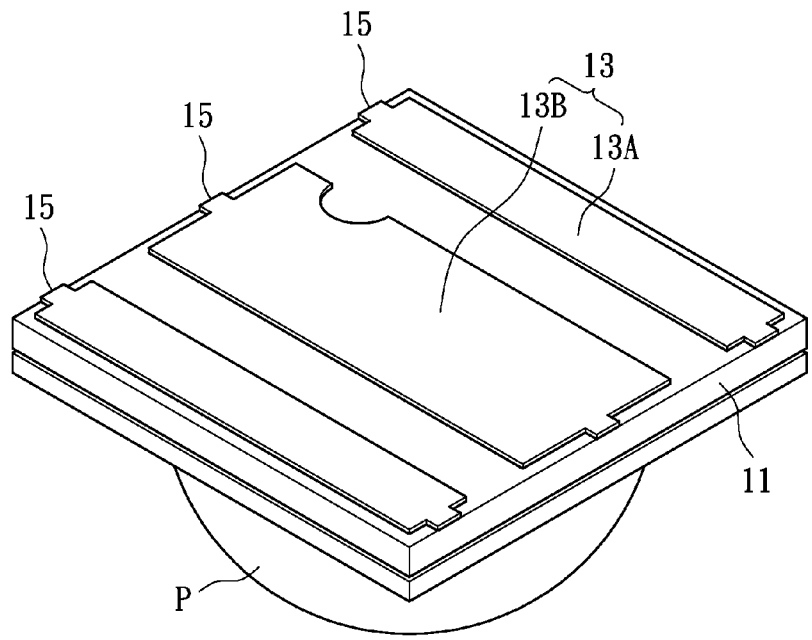
FIG. 3B shows a bottom-view of the semiconductor device of the instant disclosure.

The substrate units "S" of the mentioned substrate structure are respectively mounted the semiconductor element "D", such as a LED chip, thereon and proceed a wire-bonding process. Then, a packaging material, such as a polymer resin, covers the respective semiconductor elements "D" and cures as a packaging member "P". Thus, the semiconductor device array is formed. The semiconductor device array can be diced to individual semiconductor devices or products, as shown in FIGS. 3A and 3B. For example, the semiconductor element "D" is mounted on a first polarity portion 12A of the carrying member 12 and is electrically connected to a second polarity portion 12B of the carrying member 12 via a wire (not shown). The conductive traces 13 and a plurality of auxiliary traces 15 formed on the substrate structure are used to connect with a main circuit of an outside system board.

The thermal stress relief structures of the instant disclosure are introduced as follows.

As shown in FIG. 1A, the first thermal stress relief structure is that the substrate structure is diced as a symmetric substrate. In other words, the lengths of the substrate structure in different axial directions, such as X axis and Y axis, are substantially equal to each other. For example, the substrate structure is diced as a square substrate which has size of 46×50 mm$^2$, 42×42 mm$^2$ or 50.8×50.8 mm$^2$ and so on. Comparing with the traditional substrate, the warpage of the substrate structure is reduced after baking, i.e. curing, under 150□, 4 hours. In the approximately square-shaped substrate structure, the straight edges along the X and Y axes have substantially the same length (i.e., the lengths between the adjacent edges are substantially the same). Therefore, the generated thermal stress is shared equally along the X and Y axes. Thus, warpage is less likely to occur along a particular axis. The heat-treated substrate structure can thus maintain flatness along its surfaces.

Figure 4:
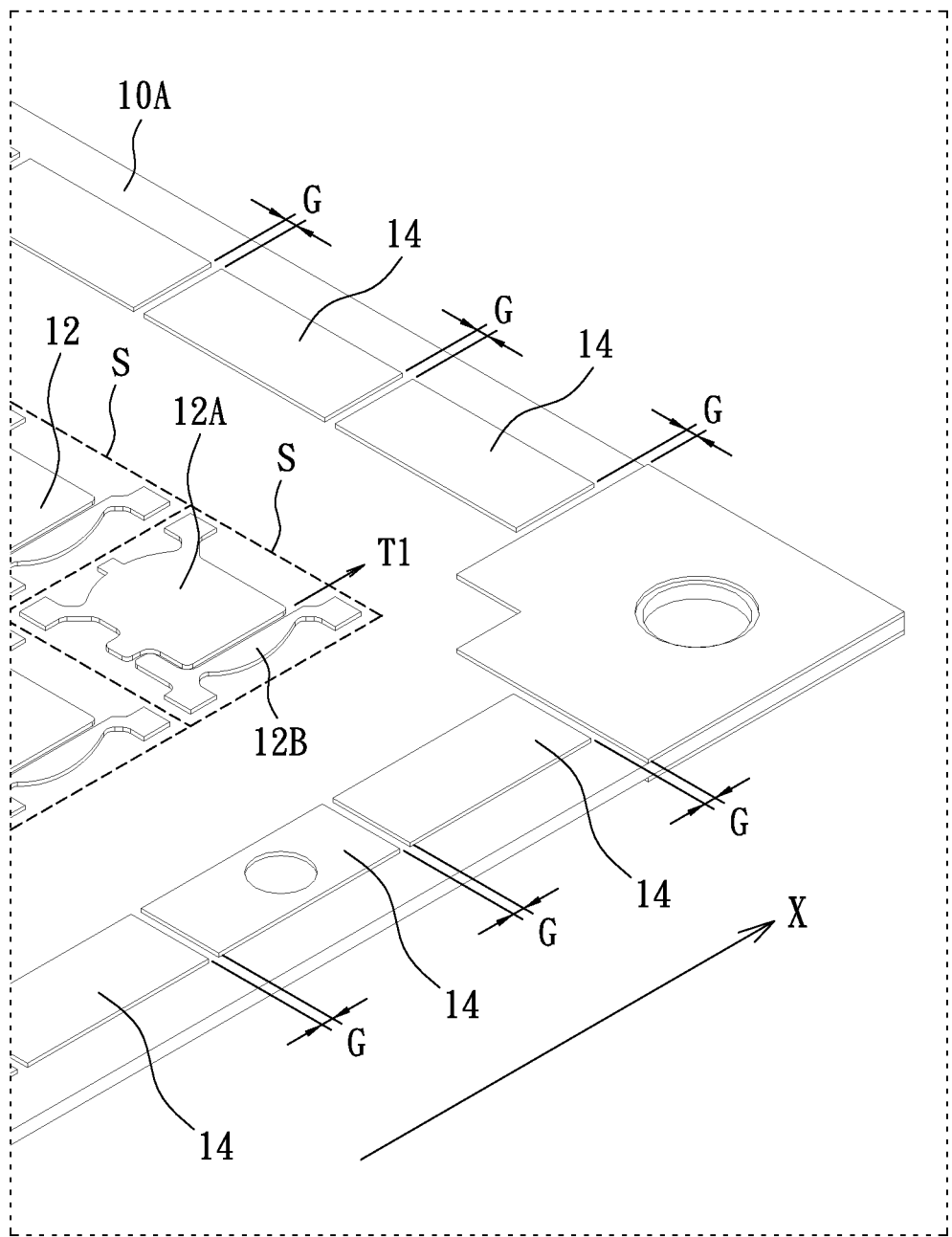
FIG. 4 shows the enlarged view of "A" portion of FIG. 1A.

Please refer to FIGS. 1A and 4, a second thermal stress relief structure is that a plurality of separated alignment marks 14 are formed on the substrate structure. For alignment in dicing, die-mounting or wire-bonding, the alignment marks 14 are formed on a periphery of both the first surface 10A and the second surface 10B or merely formed on one of the first surface 10A and the second surface 10B, and the alignment marks 14 are arranged in a frame shape. In the traditional technology, the traditional alignment mark is formed as a continuous frame shape and the thermal stress occurs to drive the warpage superimposed. On the contrary, the present alignment marks 14 are formed independently and separated. In other words, the present alignment marks 14 are spaced apart from each other and any two adjacent alignment marks 14 in the same axial directions have a gap "G" therebetween. That is to say, the traditional integrated alignment mark is changed into a plurality of individual alignment marks 14 of the instant disclosure by etching or cutting methods. When the substrate structure is processed under a higher temperature, the thermal stress may be relieved through the gap "G" between the adjacent alignment marks 14. Thus, the warpage of the substrate structure is reduced. Further, the alignment marks 14 may be formed of copper foil existed in the substrate structure.

Figure 7A:
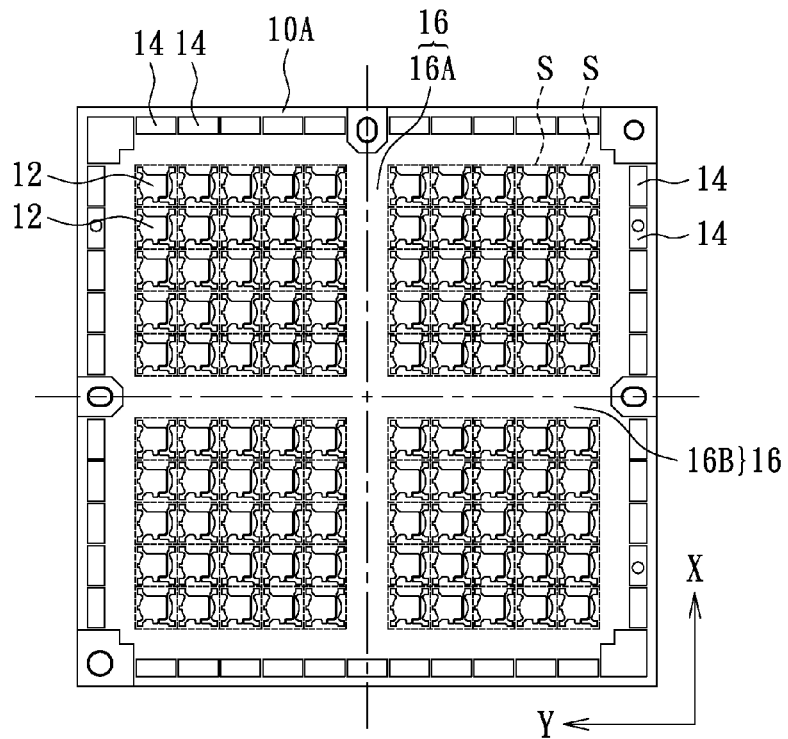
FIG. 7A shows a top view of the substrate structure of the instant disclosure.
Figure 7B:
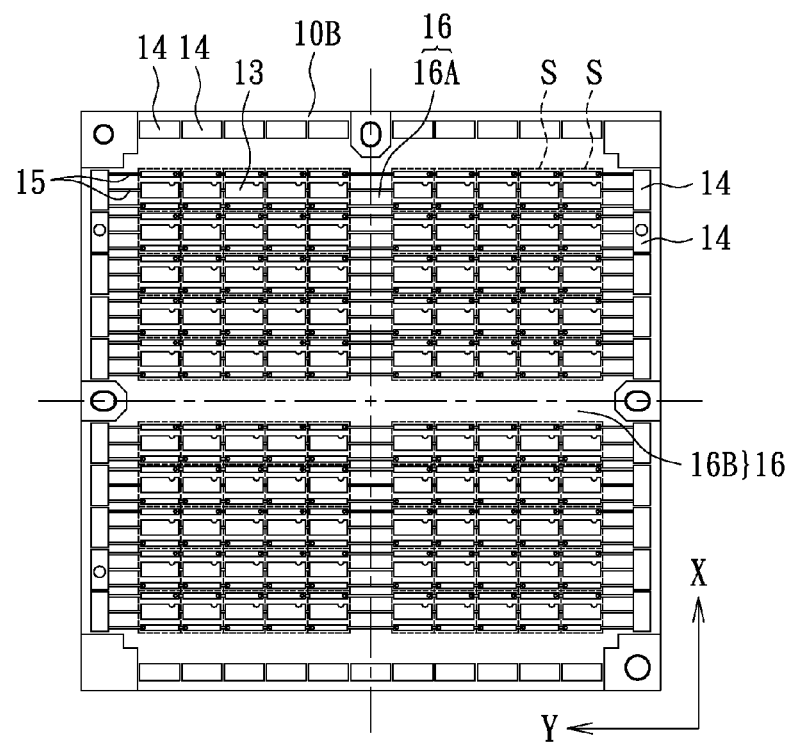
FIG. 7B shows a bottom view of the substrate structure of the instant disclosure.

The third thermal stress relief structure, as shown in FIGS. 1A, 7A and 7B, is that the substrate structure has at least one clearance area 16 extending along one of the axial directions of the substrate structure. The clearance area 16 is defined as an area where the first surface 10A has no carrying member 12 and the second surface 10B has no conductive trace 13. However, the auxiliary traces 15 may locate on the clearance area 16 for the conductivity of the processes. In other words, the auxiliary traces 15 are formed on the second surface 10B and between the conductive traces 13 of the adjacent substrate units "S". That is to say, the auxiliary traces 15 are connected between adjacent conductive traces on the second surface. Preferably, the clearance area 16 is located transversely or longitudinally on a middle portion of the substrate structure for balancing the thermal stress. Moreover, the substrate structure is divided into two substantial symmetric areas by the clearance area 16.

Taking FIGS. 7A, 7B as an exemplary embodiment, the first clearance area 16A is located in a half of the Y axis of the substrate structure and extending transversely along the X axis. The second clearance area 16B is located in a half of the X axis of the substrate structure and extending longitudinally along the Y axis. The first and the second clearance areas 16A, 16B cross on a central point of the substrate structure so as to balance the thermal stress. Because there is no copper material (e.g., the carrying member 12 and the conductive trace 13) or only some auxiliary traces 15 having less area thereon, the thermal stress may be relieved through the clearance area 16 to reduce the warpage of the substrate structure. Furthermore, each of the conductive traces 13 has a first conductive portion 13A and a second conductive portion 13B, and each of the carrying members 12 has a first polarity portion 12A and a second polarity portion 12B. The extending direction of the auxiliary traces 15 is the same with the extending direction of a space defined by the first conductive portion 13A and the second conductive portion 13B, and is different from the extending direction of a space defined by the first polarity portion 12A and the second polarity portion 12B.

In an alternatively embodiment, the substrate structure may have single clearance area 16. For example, only the first clearance area 16A is formed on the substrate structure, or only the second clearance area 16B is formed on the substrate structure. Taking the single first clearance area 16A as an example, the first clearance area 16A is formed in the half of the Y axis of the substrate structure and the auxiliary traces 15 are formed on the first clearance area 16A. Thus, the extending direction of the auxiliary traces 15 is the same with the extending direction of the space defined by the first conductive portion 13A and the second conductive portion 13B, and is different from the extending direction of the space defined by the first polarity portion 12A and the second polarity portion 12B. Taking the single second clearance area 16B as another example, the second clearance area 16B is formed in the half of the X axis of the substrate structure and there is no copper material, such as the carrying member 12, the conductive trace 13 or the auxiliary trace 15, located on the second clearance area 16B.

Figure 8A:
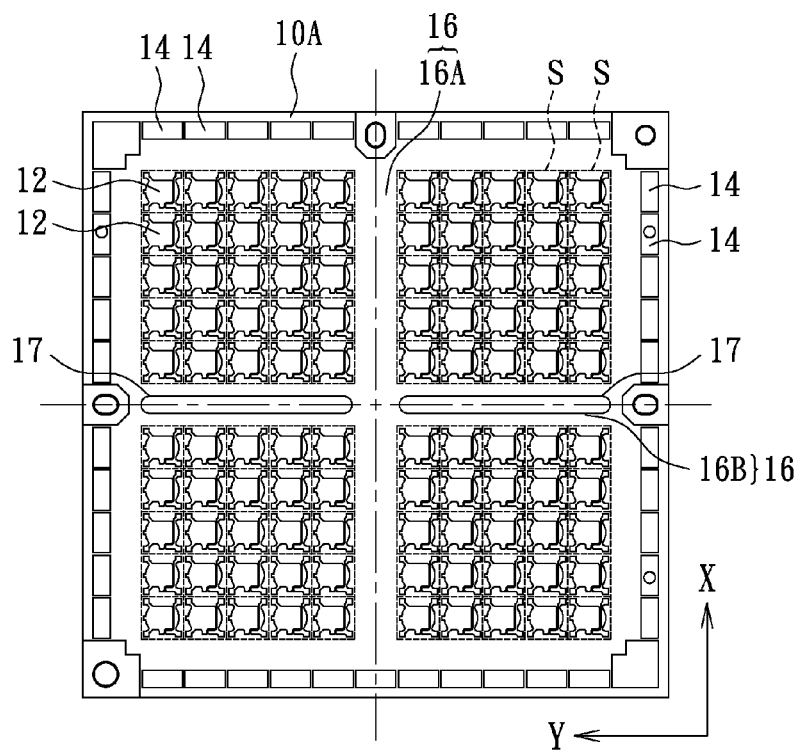
FIG. 8A shows a top view of the substrate structure according to the second embodiment of the instant disclosure.
Figure 8B:
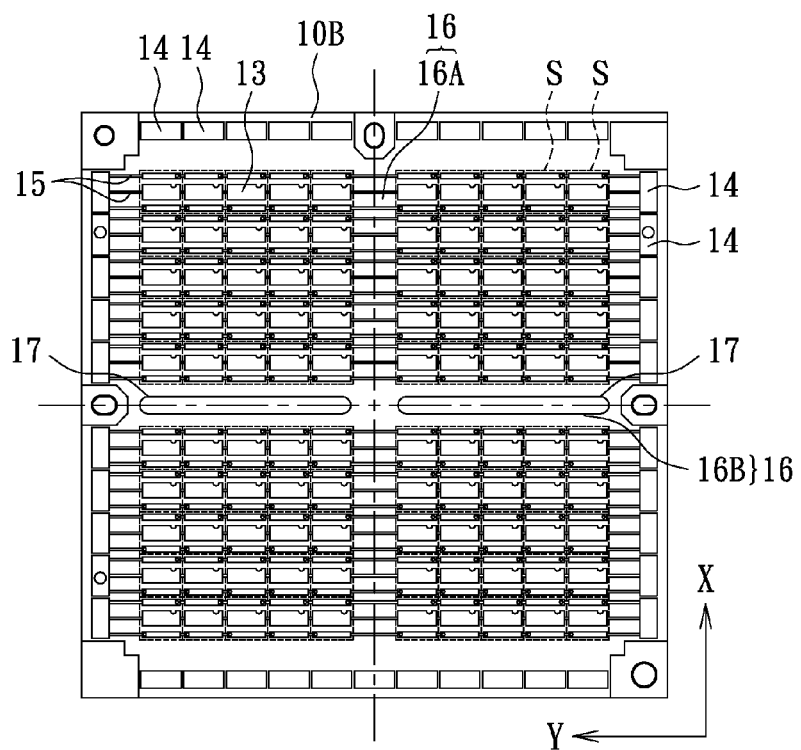
FIG. 8B shows a bottom view of the substrate structure according to the second embodiment of the instant disclosure.

On the other hand, at least one hole 17 is formed on the clearance area 16 of the substrate structure to enhance releasing of the thermal stress. For electroplating process, the auxiliary traces 15 are used for conductivity. Thus, the hole 17 is formed on the clearance area 16 where no copper material. As shown in FIGS. 8A and 8B, the auxiliary traces 15 are disposed on the first clearance area 16A to conduct the conductive trace 13 and there is no auxiliary trace 15 disposed on the second clearance area 16B. Thus, two holes 17 are formed on the second clearance area 16B. In other words, the first clearance area 16A elongated along X axis has no hole 17 and the second clearance area 16B elongated along Y axis has two holes 17 thereon.

Figure 9:
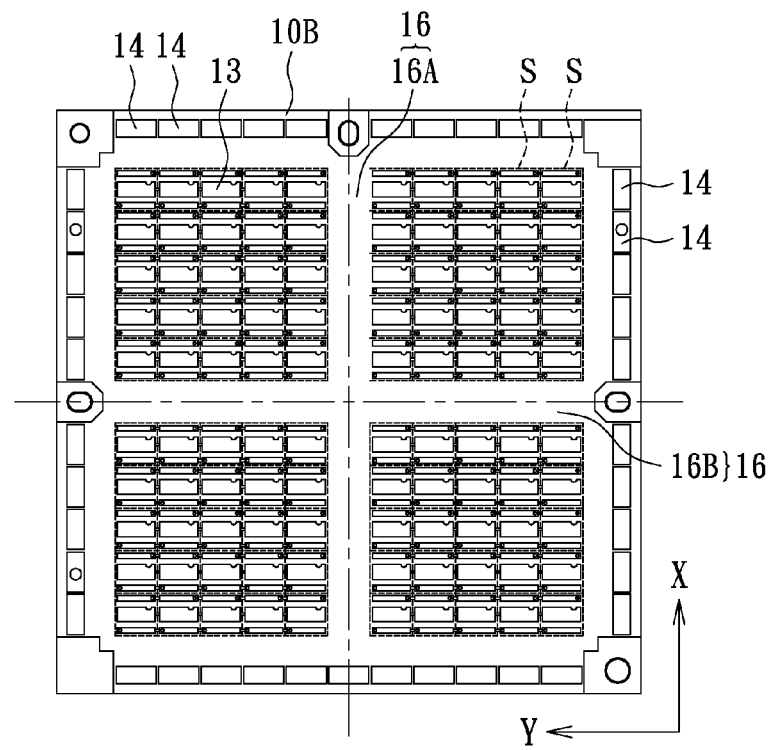
FIG. 9 shows a bottom view of the substrate structure according to the third embodiment of the instant disclosure.
Figure 10:
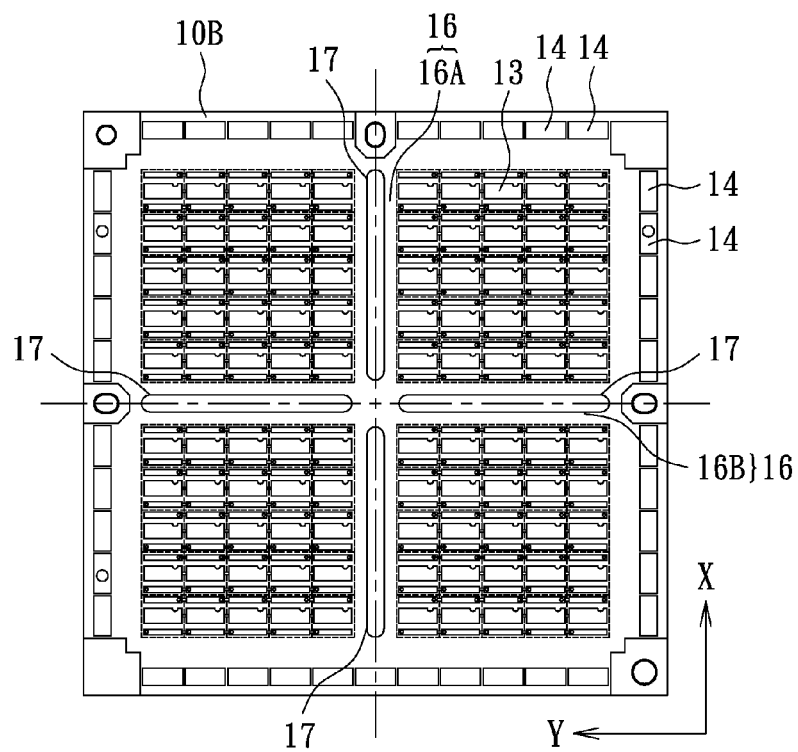
FIG. 10 shows a bottom view of the substrate structure according to the fourth embodiment of the instant disclosure.

For electroless-plating process, there is no auxiliary trace 15 formed the first clearance area 16A and the second clearance area 16B. As shown in FIG. 9, the first and the second clearance areas 16A, 16B has no auxiliary trace 15 disposed thereon, and there is no hole 17 formed on the first and the second clearance areas 16A, 16B. In another embodiment of electroless-plating process, the first and the second clearance areas 16A, 16B has no auxiliary trace 15 disposed thereon, and there are two holes 17, as shown in FIG. 10, formed on the first and the second clearance areas 16A, 16B.

Figure 5:
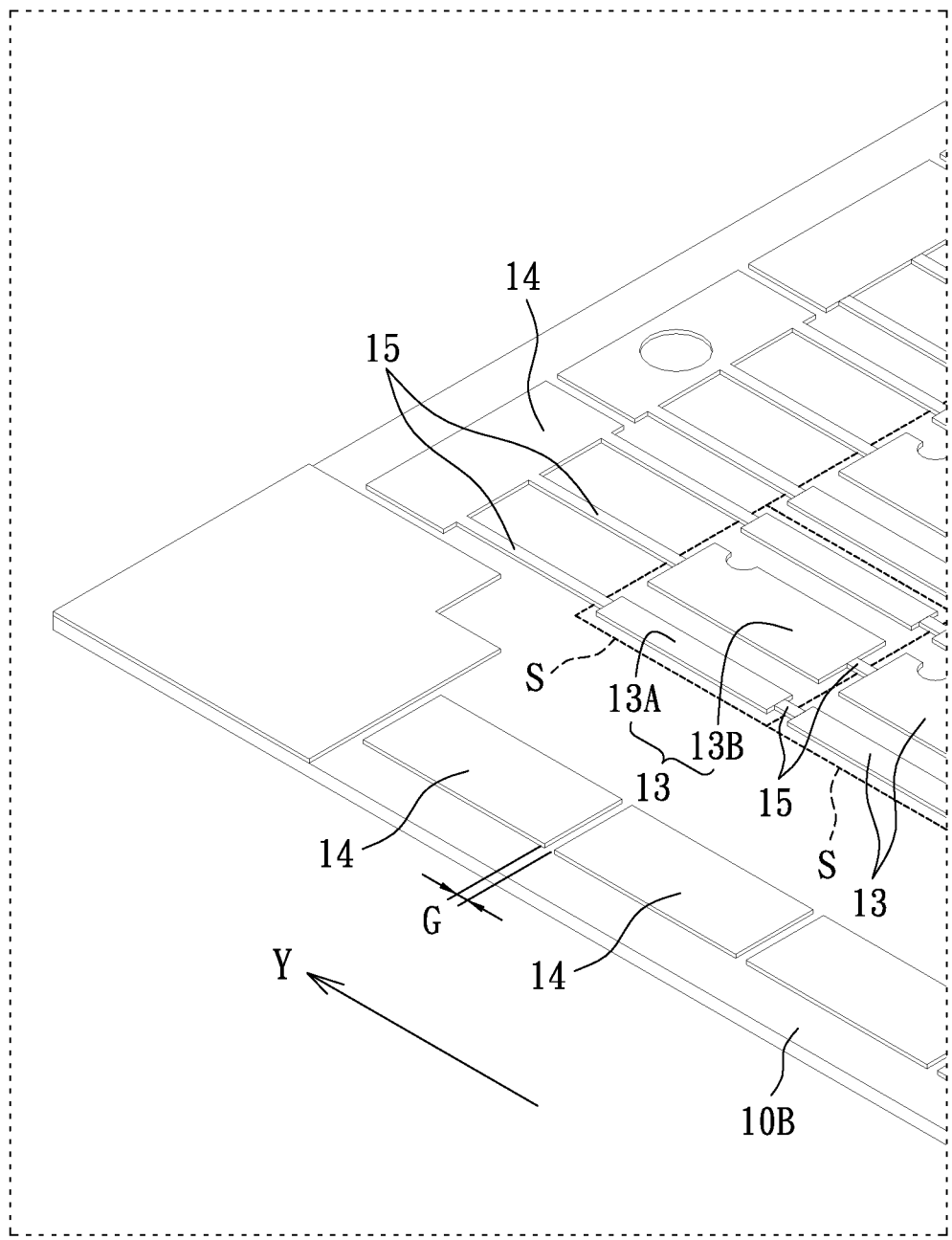
FIG. 5 shows the enlarged view of "B" portion of FIG. 1B.

The present fourth thermal stress relief structure is that the area of the auxiliary trace 15 is reduced. As shown in FIGS. 1B and 5, the area of the auxiliary trace 15 is shrunk as the minimum processing width. Normally, on the second surface 10B (i.e., the lower surface of the core layer 11), the auxiliary traces 15 are formed between the conductive traces 13 of the adjacent substrate units S. The advantages of shrinking the size of the auxiliary trace 15 are mentioned as follows. The amount of the usage of copper material on the second surface 10B may be reduced. Thus, the amount of the usage of copper material on the first and the second surfaces 10A, 10B may be substantially equal to each other. As a result, the thermal stress occurring on the first and the second surfaces 10A, 10B is balanced so as to keep the flatness of the substrate structure. The carrying member 12, the conductive trace 13, the auxiliary trace 15 are made of Cu. Traditionally, the amount of the usage of copper material on the second surface 10B including the conductive trace 13, the alignment mark 14 and the auxiliary trace 15 are greater than the amount of the usage of copper material on the first surface 10A including carrying member 12 and alignment mark 14, thus conventional substrate structure occurs warpage. On the contrary, the fourth thermal stress relief structure is reducing the usage of copper material on the second surface 10B by shrinking the size of the auxiliary traces 15. Thus, the usage amount of copper material on the first and the second surfaces 10A, 10B are substantially equal to each other, and the thermal stresses occurring on the first and the second surfaces 10A, 10B have contrary directions and the substantially same magnitude, which may be balancing to each other. Accordingly, after undergoing the high temperature process, the substrate structure remains its flatness.

In addition, the size reduction of the auxiliary traces 15 is beneficial in addressing the issue of metal burr extending beyond the copper edge after the cutting process, i.e. singulating, and the stripping issue of substrate structure and packaging material. By resolving these issues, water content can be prevented from intruding the substrate structure for enhancing product reliability. Specifically, the width of the conventional auxiliary traces is substantially the same as that of the conductive traces 13. After the packaging process is complete and during the cutting process for the semiconductor device, the ductility of copper material may cause metal burr extending beyond the copper edge in creating a rough surface. Accordingly, stripping problems are likely to occur for the substrate structure and the packaging material, along with water intrusion issue. On the contrary, the present auxiliary traces 15 having smaller size and width may solve the problems of the significant "burr" and the packaging member peeling. Accordingly, the present auxiliary trace 15, which has a shrunk size smaller than that of the conductive trace 13 may not only minimize the warpage of the substrate structure but also solve the low reliability issue which is resulted from the burr structure while dicing.

Figure 6:
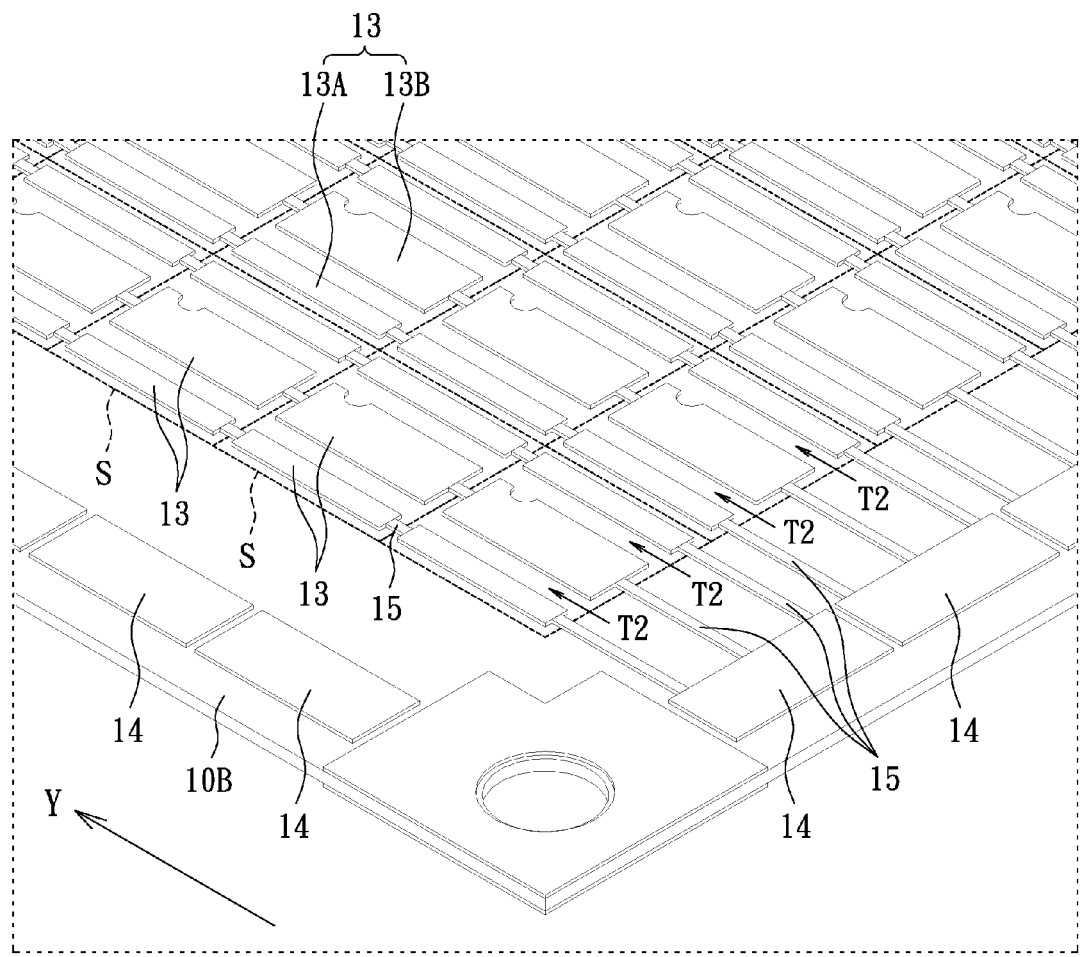
FIG. 6 shows the enlarged view of "C" portion of FIG. 1B.

The present fifth thermal stress relief structure is that the number of the auxiliary trace 15 is reduced and the extending direction of the auxiliary traces is re-arranged, as shown in FIGS. 1B and 6. In the traditional arrangement, the traditional auxiliary traces extend in two different axial directions, i.e. X, Y axes, of the substrate structure and along the direction of soldering path. The soldering path is defined as the columns arranged between the copper traces and the solder could be sufficiently flowed along the column under the solder process.

The present fifth thermal stress relief structure is that the auxiliary traces 15 are existed in only one extending direction, and thus the quantity of the auxiliary trace 15 in the present substrate structure can be reduced. On the contrary, the traditional auxiliary traces 15 must be formed along two extending directions of the traditional substrate. The effect of the reduced quantity of the auxiliary trace 15 is similar with the effect of the reduced area of the auxiliary trace 15, which is described in the fourth thermal stress relief structure. Further, the width of the auxiliary trace 15 of the fifth thermal stress relief structure may be shrunk as the minimum processing width, as the mentioned fourth stress relief structure. In other words, the usage amount of copper material on the first and the second surfaces 10A, 10B are substantially equal to each other, and the thermal stresses occurring on the first and the second surfaces 10A, 10B have contrary directions and the substantially same magnitude, which may be balancing to each other.

Moreover, for releasing thermal stress concentration, the extending direction of each auxiliary trace 15 is parallel to the soldering path "T2" of the conductive trace 13 (e.g., the soldering path "T2" of the conductive trace 13 is parallel to Y axis of the substrate structure), but is different from the soldering path "T1" of the carrying member 12 (e.g., the soldering path "T1" of the carrying member 12 is parallel to X axis of the substrate structure). As shown in FIGS. 5 and 6, the soldering path "T2" is defined as the column arranged between the first and the second conductive portions 13A, 13B, which is parallel to Y axis of the substrate structure. Similarly, the soldering path "T1", as shown in FIGS. 1A and 4, is defined as the column arranged between the first and the second polarity portions 12A, 12B, which is parallel to X axis of the substrate structure. In detailed arrangement, the soldering path "T2" of the conductive trace 13 is preferably perpendicular to the soldering path "T1" of the carrying member 12. In other words, the extending direction of a space (i.e., the column) defined by the first conductive portion 13A and the second conductive portion 13B is perpendicular to the extending direction of a space defined by the first polarity portion 12A and the second polarity portion 12B. By arranging the extending direction of each auxiliary trace 15, the soldering path "T1" and the soldering path "T2" as the above-mentioned arrangement, the thermal stress occurring on the first and the second surfaces 10A, 10B has contrary directions (i.e., X and Y axes) to solve the warpage issue that the thermal stress is accumulated on a single axis.

Combining the above first to fifth thermal stress relief structures, the substrate structure sized as 50.8 mm×50.8 mm is experimented through a high temperature process. The maximum value of warpage is smaller than 0.8 mm, preferably smaller than 0.5 mm. According to referenced test method IPC-TM-650 (Section 2.4.22), the bow degree is calculated as smaller than 1.6%, preferably smaller than 1.0%. Thus, the present substrate structure has minimized warpage so as to improve the reliability of the product using the present substrate structure.

In addition, the experimented substrate structure has a thickness of 0.35 mm. In another embodiment, the thickness of the substrate structure may be ranged from 1.3 mm to 0.9 mm and the substrate structure may be selectively coated with Ni/Au layer having thickness greater than 0.3 um and Ni/Ag layer having thickness greater than 3 um. The coated Au material may improve the reliability of product and the coated Ag material may increase the reflective ratio of the product.

The description above only illustrates specific embodiments and examples of the instant disclosure. The instant disclosure should therefore cover various modifications and variations made to the herein-described structure and operations of the instant disclosure, provided they fall within the scope of the instant disclosure as defined in the following appended claims.

What is claimed is:

1. A substrate structure being laminated by pressing composite materials and metal materials, the substrate structure comprising:
   a core layer, made of insulating material having a first surface and a second surface opposite to the first surface;
   a plurality of carrying members, made of metal, being formed on the first surface of the core layer for respectively receiving a plurality of semiconductor elements thereon;
   a plurality of conductive traces being formed on the second surface of the core layer; and
   a plurality of slugs, made of metal, embedded in the core layer to respectively connect between the carrying members and the conductive traces for dissipating heat from the semiconductor elements to the conductive traces;
   wherein the substrate structure has a first, a second and a third thermal stress relief structures formed thereon;
   wherein the third thermal stress relief structure is that the substrate structure has at least one clearance area extending along one of the axial directions of the substrate structure, and the clearance area is without the carrying members and conductive traces.

2. The substrate structure as claimed in claim 1, further comprising a fourth thermal stress relief structure, wherein a plurality of auxiliary traces are formed on the substrate structure, the fourth thermal stress relief structure is that a width of each of the auxiliary traces is smaller than that of each of the conductive traces.

3. The substrate structure as claimed in claim 2, wherein the auxiliary traces are extended along a single axial direction.

4. The substrate structure as claimed in claim 2, wherein the second thermal stress relief structure is that a plurality of separated alignment marks are formed on the substrate structure, wherein the auxiliary traces are formed on the second surface of the core layer, the auxiliary traces are disposed between any two adjacent conductive traces, or between the conductive traces and the alignment marks.

5. The substrate structure as claimed in claim 2, wherein each of the conductive traces has a first conductive portion and a second conductive portion, each of the carrying members has a first polarity portion and a second polarity portion, the extending direction of the auxiliary traces is parallel to the extending direction of a space defined by the first conductive portion and the second conductive portion, and the extending direction of the auxiliary traces is different from the extending direction of a space defined by the first polarity portion and the second polarity portion.

6. The substrate structure as claimed in claim 5, wherein the second thermal stress relief structure is that a plurality of separated alignment marks are formed on the substrate structure, wherein the auxiliary traces are disposed between any two adjacent first polarity portions or any two adjacent second polarity portions, or between the alignment marks and the first polarity portions or second polarity portions.

7. The substrate structure as claimed in claim 1, further comprising a fifth thermal stress relief structure in that a plurality of auxiliary traces formed on the substrate structure are extended along a single axial direction.

8. The substrate structure as claimed in claim 7, wherein the auxiliary traces are formed on the second surface of the core layer, the auxiliary traces are disposed between any two adjacent conductive traces, or between the conductive traces and the alignment marks.

9. The substrate structure as claimed in claim 7, wherein a width of each of the auxiliary traces is smaller than that of each of the conductive traces.

10. The substrate structure as claimed in claim 7, wherein each of the conductive traces has a first conductive portion and a second conductive portion, each of the carrying members has a first polarity portion and a second polarity portion, the extending direction of the auxiliary traces is parallel to the extending direction of a space defined by the first conductive portion and the second conductive portion, and the extending direction of the auxiliary traces is different from the extending direction of a space defined by the first polarity portion and the second polarity portion.

11. The substrate structure as claimed in claim 10, wherein the extending direction of the auxiliary traces is perpendicular to the extending direction of a space defined by the first polarity portion and the second polarity portion.

12. The substrate structure as claimed in claim 1, wherein the second thermal stress relief structure is that a plurality of separated alignment marks are formed on the substrate structure, wherein any two adjacent alignment marks have a gap therebetween, and the alignment marks are disposed on a periphery of the first surface of the core layer or on a periphery of the second surface of the core layer.

13. The substrate structure as claimed in claim 1, wherein each of the conductive traces has a first conductive portion and a second conductive portion, each of the carrying members has a first polarity portion and a second polarity portion, an extending direction of a space defined by the first conductive portion and the second conductive portion is perpendicular to the extending direction of a space defined by the first polarity portion and the second polarity portion.

14. The substrate structure as claimed in claim 1, wherein the clearance area is an area without the carrying members on the first surface, or the clearance area is an area without the conductive traces on the second surface.

15. The substrate structure as claimed in claim 14, wherein the clearance area has a first clearance area and a second clearance area, the first and the second clearance areas are cross to each other.

16. The substrate structure as claimed in claim 15, wherein the first clearance area or the second clearance area has at least one hole.

17. The substrate structure as claimed in claim 14, wherein a plurality of auxiliary traces disposed between the adjacent conductive traces or between the conductive traces and the alignment marks are located on the clearance area, each of the conductive traces has a first conductive portion and a second conductive portion, each of the carrying members has a first polarity portion and a second polarity portion, an extending direction of the auxiliary traces is parallel to an extending direction of a space defined by the first conductive portion and the second conductive portion, and the extending direction of the auxiliary traces is different from the extending direction of a space defined by the first polarity portion and the second polarity portion.

18. A semiconductor device array, comprising;
   a substrate structure being laminated by pressing composite materials and metal materials, the substrate structure having a first surface and a second surface corresponding to the first surface, a plurality of carrying members being formed on the first surface, a plurality of conductive traces being formed on the second surface, the carrying members and the conductive traces defining a plurality of substrate units, the substrate structure having a first, a second and a third thermal stress relief structures formed thereon; and
   wherein the third thermal stress relief structure is that the substrate structure has at least one clearance area extending along one of the axes of the substrate structure, the clearance area is without the carrying members and the conductive traces;
   a plurality of semiconductor elements, respectively disposed on the carrying members of each of the substrate units; and
   a plurality of packaging members, respectively covering the corresponding semiconductor elements;
   wherein a plurality of auxiliary traces is connected between adjacent conductive traces on the second surface.

19. The semiconductor device array of claim 18, wherein the first thermal stress relief structure is that lengths of the substrate structure in different axes are substantially equal to each other;
   wherein the second thermal stress relief structure is that a plurality of separated alignment marks are formed on the substrate structure.

20. A semiconductor device being formed by dicing the semiconductor device array as claimed in claim 18.

* * * * *